United States Patent
Blanco et al.

(10) Patent No.: US 7,251,794 B2
(45) Date of Patent: Jul. 31, 2007

(54) SIMULATION TESTING OF DIGITAL LOGIC CIRCUIT DESIGNS

(75) Inventors: Rafael Blanco, Essex Junction, VT (US); Suzanne Granato, Essex Junction, VT (US); Francis A. Kampf, Jeffersonville, VT (US); Douglas T. Massey, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 281 days.

(21) Appl. No.: 10/904,056

(22) Filed: Oct. 21, 2004

(65) Prior Publication Data

US 2006/0090149 A1 Apr. 27, 2006

(51) Int. Cl.
G06F 17/50 (2006.01)
(52) U.S. Cl. .................................. 716/4; 716/5; 716/6
(58) Field of Classification Search ................ 716/4–6; 703/13–17; 714/32, 37, 43
See application file for complete search history.

(56) References Cited

U.S. PATENT DOCUMENTS

| | | | |
|---|---|---|---|
| 5,161,115 A * | 11/1992 | Teshima et al. | 702/108 |
| 5,650,938 A * | 7/1997 | Bootehsaz et al. | 716/6 |
| 6,816,827 B1 * | 11/2004 | Xia et al. | 703/15 |
| 7,017,068 B2 * | 3/2006 | McBride et al. | 713/401 |
| 2005/0120278 A1 * | 6/2005 | Smith et al. | 714/43 |

* cited by examiner

Primary Examiner—Vuthe Siek
(74) Attorney, Agent, or Firm—Schmeiser, Olsen & Watts; Anthony J. Canale

(57) ABSTRACT

A method and system for testing a circuit design. The method including generating a simulation model of the circuit design, the circuit design comprising one or more source latches, one or more destination latches and a logic function connected between the source latches and the destination latches; generating a modified simulation model of the simulation model by inserting random skew between an output of each source latch and an input of the logic function only in asynchronous data paths between the source latches and the destination latches of the simulation model; and running the modified simulation model.

20 Claims, 9 Drawing Sheets

SIMULATION TESTING OF DIGITAL LOGIC CIRCUIT DESIGNS

FIELD OF THE INVENTION

The present invention relates to the field of circuit design methodology; more specifically, it relates to a method for simulation testing of circuit designs having asynchronous data paths.

BACKGROUND OF THE INVENTION

Simulation of digital logic circuits is performed is using simulation models. The logic function of logic designs containing asynchronous logic boundaries wherein a signal is launched by a circuit element in a first clock domain and captured by a circuit element in a second clock domain, the first and second clock domains specified to be asynchronous to each other, can not be verified by current simulation models. Simply adding delay to current simulation models cannot be relied on to emulate asynchronous logic behavior because, for example, the delays cannot account for such effects as temperature or voltage shifts. Current simulation models also ignore the possibility of transition glitches between the sending of logic pulses. The problem is further complicated when the digital logic circuit includes both synchronous and asynchronous data paths. Current simulation models do not model circuits with both synchronous and asynchronous data paths correctly.

Therefore, there is a need for a simulation methodology for testing and verifying digital logic circuits having asynchronous logic paths.

SUMMARY OF THE INVENTION

The present invention verifies a digital logic circuit design having asynchronous data paths by inserting state machine models into the asynchronous data paths of the simulation model of the digital logic circuit design. The state machines add random skew to the asynchronous data paths in order to simulate asynchronous arrival of data at the logic function coupled between source and destination latches.

A first aspect of the present invention is a method of testing a circuit design, comprising: generating a simulation model of the circuit design, the circuit design comprising one or more source latches, one or more destination latches and a logic function connected between the source latches and the destination latches; generating a modified simulation model of the simulation model by inserting random skew between an output of each source latch and an input of the logic function only in asynchronous data paths between the source latches and the destination latches of the simulation model; and running the modified simulation model.

A second aspect of the present invention is a method of testing a circuit design, comprising: (a) generating a simulation model of the circuit design, the circuit design comprising one or more source latches, each source latch responsive to one of two or more clock domains, one or more destination latches, each destination latch responsive to one of the two or more of the clock domains, at least one destination latch and one source latch responsive to different clock domains of the two or more clock domains, and a logic function connected between outputs of the source latches and inputs of the destination latches; (b) identifying a source clock domain for each source latch and a destination clock domain for each destination latch; (c) for a given destination latch identifying all source latches coupled to a different clock domain than the destination clock domain; (d) inserting a state machine model between an output of each source latch identified in step (c) and a corresponding input of the logic function in the simulation model; (e) coupling each state machine model inserted in step (d) to the destination clock domain; and (f) running the simulation model.

A third aspect of the present invention is a computer system comprising a processor, an address/data bus coupled to the processor, and a computer-readable memory unit coupled to the processor, the memory unit containing instructions that when executed by the processor implement a method for testing a circuit design, the method comprising the computer implemented steps of: generating a simulation model of the circuit design, the circuit design comprising one or more source latches, one or more destination latches and a logic function connected between the source latches and the destination latches; generating a modified simulation model of the simulation model by inserting random skew between an output of each source latch and an input of the logic function only in asynchronous data paths between the source latches and the destination latches of the simulation model; and running the modified simulation model.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

It should be understood that the present invention is applied to circuit designs and not physical circuits and that testing of the designs is accomplished by building simulation models of the circuit and applying simulated input to the simulation model of the circuit.

For the purposes of the present invention the terms testing and verification should be considered as synonymous terms.

A clock cycle is defined as the time between consecutive rising or consecutive falling edges of the clock signal. An asynchronous data path is defined as a signal path between an output of a source latch responsive to a first clock signal and the input of a destination latch responsive to a second clock signal where the first and second clock signals are not supplied from the same clock pin (i.e. are from different clock domains and the rising and falling edges of the two clock signals are not constrained to occur at the same time). A synchronous data path is defined as a signal path between an output of a source latch responsive to a clock signal and the input of a destination latch also responsive to the same clock signal. A source and a destination latch are defined as synchronous or asynchronous relative to one another based on whether the source latch and the destination latch are coupled to the same clock signal (synchronous) or not (asynchronous). A first latch may be synchronous to a second latch and asynchronous to a third latch.

Source latches may be replaced with launch flip-flops and destination latches may be replaced with capture flip-flops, however, the invention will be described with reference to source and destination latches.

Figure 1:
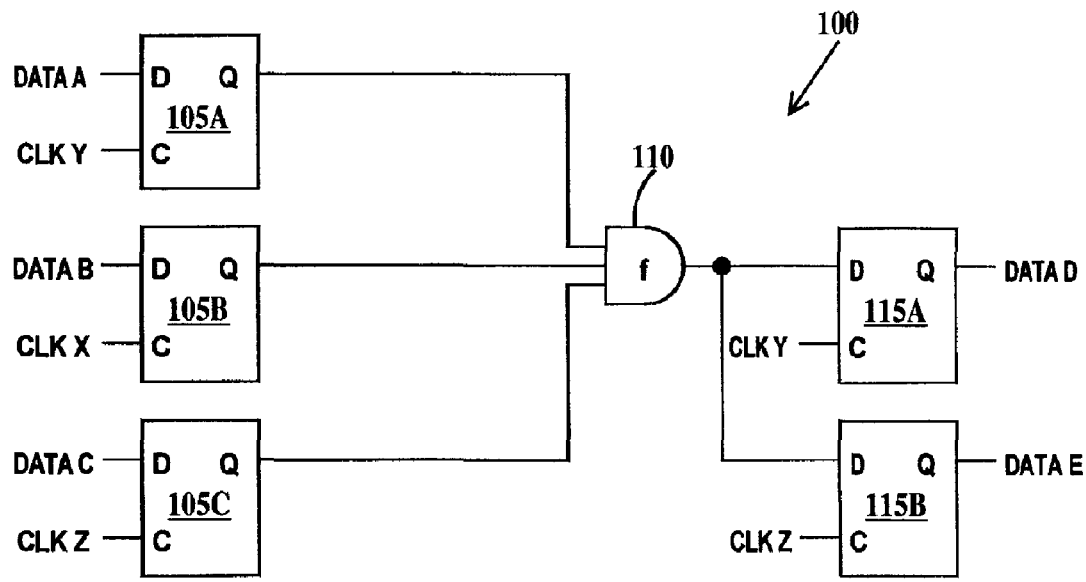
FIG. 1 is a schematic circuit diagram of an exemplary digital logic circuit design.

FIG. 1 is a schematic circuit diagram of an exemplary digital logic circuit design. In FIG. 1, logic circuit design 100 includes source latches 105A, 105B, and 105C, an AND gate 110, and destination latches 115A and 115B. Source latch 105A, source latch 105B, source latch 105C, destination latch 115A and destination latch 105B each have a data input D, a clock input C and a data output Q. AND gate 110 is an exemplary logic function and other logic functions may be subsituted. The data input of source latch 105A is coupled to a data A signal, the clock input of source latch 105A is coupled to a CLK Y clock signal and the output of source latch 105A is connected to a first input of AND gate 110. The data input of source latch 105B is coupled to a data B signal, the clock input of source latch 105B is coupled to a CLK X clock signal and the output of source latch 105B is connected to a second input of AND gate 110. The data input of source latch 105C is coupled to a data C signal, the clock input of source latch 105C is coupled to a CLK Z clock signal and the output of source latch 105C is connected to a third input of AND gate 110. The data inputs of destination latches 115A and 115B are each connected to the output of AND gate 110. The clock input of destination latch 115A is coupled to the CLK Y clock signal and the output of destination latch 115A generates a data D signal. The clock input of destination latch 115B is coupled to the CLK Z clock signal and the output of destination latch 115B generates a data E signal.

Clock signals CLK X, CLK Y and CLK Z are asynchronous to each other. Thus destination latch 115A is synchronous to source latch 105A and asynchronous to source latches 105B and 105C and destination latch 115B is synchronous to source latch 105C and asynchronous to source latches 105B and 105C. The data D and data E signals have the same logic level but are asynchronous to each other.

There are eight possible logical zero-delay simulation (a synchronous simulation model) scenarios that can be run on a simulation model of logic circuit design 100 of FIG. 1, three of which are listed in TABLE I. In Table I, data signals A, B and C arrive at the same time (synchronously) at respective first, second and third inputs of the AND gate.

TABLE I

| EVENT | Data A Signal | Data B Signal | Data C Signal | AND Gate Output |
|---|---|---|---|---|
| 0 | 0 | 0 | 1 | 0 |
| 1 | 1 | 1 | 0 | 0 |
| 2 | 0 | 1 | 1 | 0 |

However, in actual operation data arrival at the inputs of the AND gate may occur at different times (asynchronously) relative the phase of the clock domain of the source latch of each data signal and very many different actual scenarios can occur for logic circuit design 100, three of which are listed in TABLE II. In Table II data signals A, B and C arrive at respective first, second and third inputs of the AND relative to each signals clock domain at the various times indicated.

TABLE II

| EVENT | Data A Signal | Data B Signal | Data C Signal | AND Gate Output |
|---|---|---|---|---|
| 0 | 0 | 0 | 1 | 0 Logic Level |
| 1 | Transition Low to High Early | Transition Low to High Early | Transition High to Low Late | Logic Level High Glitch |
| 2 | Transition High to Low Late | 1 | Transition Low to High Early | Logic Level High Glitch |

Event 0 of table II illustrates an on time arrival of data signals A, B and C at the AND gate inputs. In event 1, data signals A, B and C are delayed (for the purposes of the present invention, early arrival can be considered negative delay). In event 2, data signals A and C are delayed, while data signal B is on time.

To generate all the possible scenarios and then test the design using them is time and cost prohibitive. Using techniques such as applying random data capture to the destination latch is functionally incorrect for synchronous data paths and will not work on logic circuit design 100 (see FIG. 1) because there are both synchronous and asynchronous data paths in the logic circuit. In the present invention logic circuit design 100 (see FIG. 1) is simulated modified in a form as illustrated in FIG. 2 and then tested.

Figure 2:
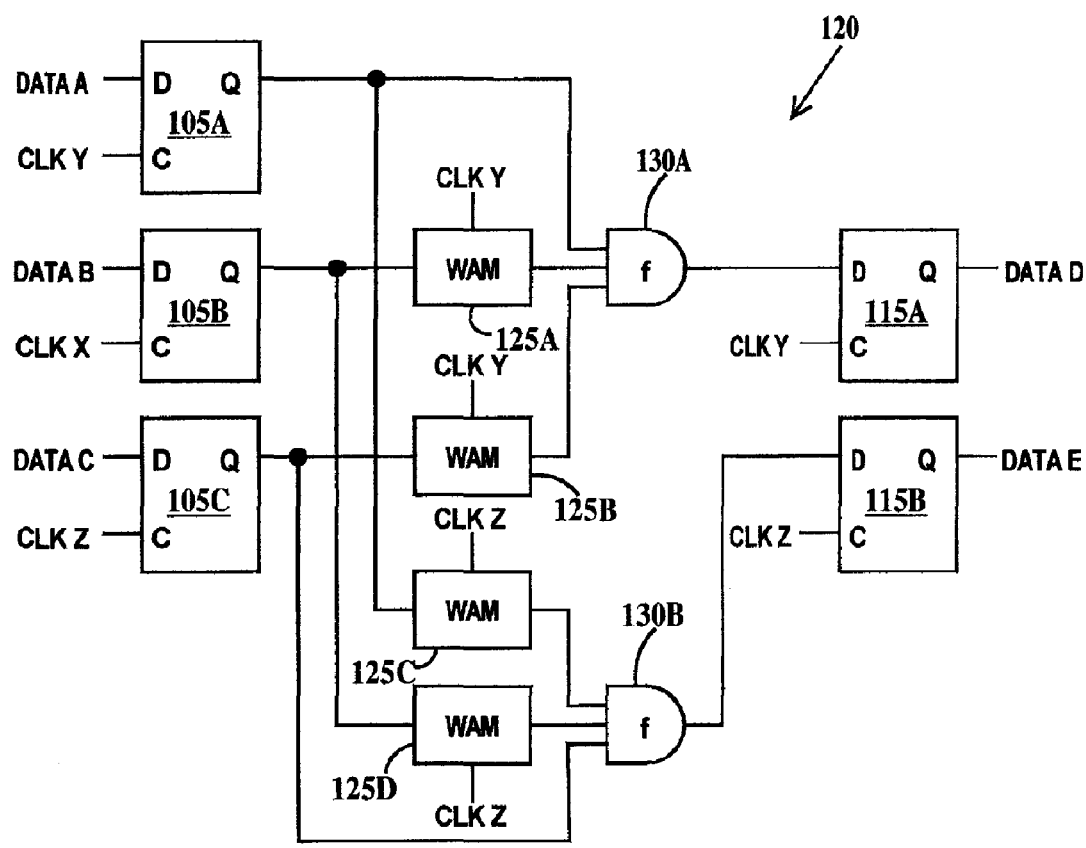
FIG. 2 is a schematic circuit diagram of the exemplary digital logic circuit design of FIG. 1 modified according to the methodology of the present invention.
Figure 3:
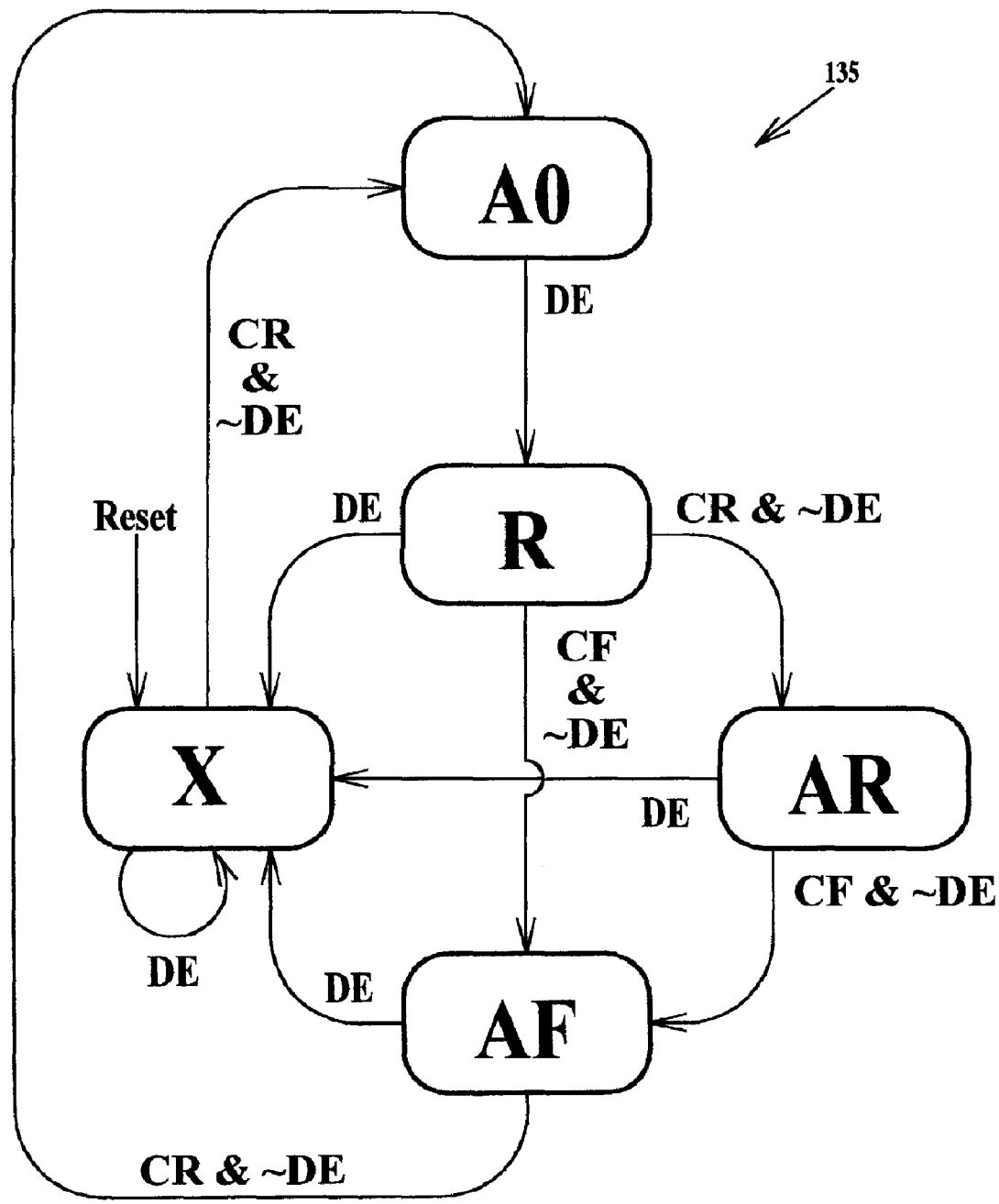
FIG. 3 is a diagram of a first exemplary state machine according to the present invention.

FIG. 2 is a schematic circuit diagram of the exemplary digital logic circuit design of FIG. 1 modified according to the methodology of the present invention. In FIG. 2, a circuit design 120 is similar to circuit design 100 of FIG. 4, except for the addition of four Wired Asynchronous Model (WAM) pseudo cells 125A, 125B, 125C and 125D and replacement of AND gate 110 with AND gates 130A and 130B and the following wiring changes. WAM pseudo cells 125A, 125B, 125C and 125D are state machines as illustrated in FIGS. 3 and 5 and described infra. The output of source latch 105A is connected to a first input of AND gate 130A and an input of WAM pseudo cell 125C. The output of source latch 105B is connected to inputs of WAM pseudo cells 125A and 125D. The output of source latch 105C is connected to a third input of AND gate 130B and an input of pseudo cells WAM 125B. Outputs of WAM pseudo cells 125A and 125B are connected, respectively, to second and third inputs of AND gate 130A. Outputs of WAM pseudo cells 125C and 125D are connected, respectively, to first and second inputs of AND gate 130B. An output of AND gate 130A is connected to the input of destination latch 115A and an output of AND gate 130B is connected to the input of destination latch 115B.

Insertion of WAM pseudo cells 125A, 125B, 125C and 125D allows the same test coverage as real time simulation (also called standard delay format (SDF) simulation) but using logical zero-delay simulation. This is accomplished by replicating the logic function so there is one identical logic function for each asynchronous destination latch and inserting WAM pseudo cells into each asynchronous data path between the source latches and the logic function. The WAM pseudo cell is coupled to the synchronous same clock signal as the destination latch it feeds is coupled to.

For example, in FIG. 2, source latch 105A and destination latch 115A are synchronous (both clocked by clock signal CLK Y) so no WAM pseudo cell is inserted into the data path from the output of source latch 105A and the input of destination latch 115A. However, both source latches 115B (clocked by clock signal CLK X) and 115C (clocked by clock signal CLK Z) are asynchronous to destination latch 115A, so WAM pseudo cell 125A is inserted into the data path between source latch 105B and destination latch 115A and WAM pseudo cell 125B is inserted into the data path between source latch 105C and destination latch 115A. Since the synchronous clock signal for destination latch 115A is clock signal CLK Y, WAM pseudo cells 125A and 125B are connected to clock signal CLK Y.

Likewise, source latch 105C and destination latch 115B are synchronous (both clocked by clock signal Z) so no WAM pseudo cell is inserted into the data path from the output of source latch 105C and the input of destination latch 115B. However, both source latches 115A (clocked by clock signal CLK Z) and 115B (clocked by clock signal X) are asynchronous to destination latch 115B, so WAM pseudo cell 125C is inserted into the data path between source latch 105 AB and destination latch 115B and WAM pseudo cell 125D is inserted into the data path between source latch 105B and destination latch 115B. Since the synchronous clock signal for destination latch 115B is clock signal CLK Z, WAM pseudo cells 125C and 125D are connected to clock signal CLK Z.

WAM pseudo cells are implemented as state machines inserted into the asynchronous data paths in circuit simulation models. A WAM pseudo cell adds random skew to the asynchronous data paths by changing the logic levels of the data signal propagating through the WAM pseudo cells in a pseudo random manner in order to simulate asynchronous arrival of data at the logic function of a cone of logic.

FIG. 3 is a diagram of a first exemplary state machine according to the present invention. In FIG. 3, a WAM state machine 135 includes states A0, R, AR, AF and X. In the A0, R, AR and AF states the value of the data transmitted from the state is either a logical one or a logical zero. The X state is a state that indicates an asynchronous error and has no value. Data is transmitted between states when defined events occur. The defined events for state machine 135 are a data edge occurs (DE) at a destination latch data input, a destination clock rising edge occurs not exactly at a data edge at a destination latch data input (CR & ~DE), and a destination clock falling edge occurs not exactly at a data edge at a destination latch data input (CF & ~DE). The term not exactly at a data edge (~DE) is defined as within a selected time of a change of the logic level on the output of a source latch (i.e. if the data transition is early or late by a selected amount of time relative to the clock edge).

A transition from the A0 state to the R state occurs upon a DE event. A transition from the R state to the AR state occurs upon a CF & ~DE event, to the AF state upon a CF & ~DE event, and to the X state upon a DE event. A transition from the AR state to the X state occurs upon a DE event, and to the AF state upon a CF & ~DE event. A transition from the AF state to the X state occurs upon a DE event, and to the A0 state upon a CR & ~DE event. A transition from the X state to the A0 state occurs upon a CR & ~DE event. A DE event in the X state causes state machine 135 to remain in the X state and a Reset signal puts the state machine into the X state at once.

From the A0, AR and AF states actual data (either a logical zero or a logical one) is transmitted when a qualifying event for a transition from that state that state occurs. From the R state, a logical zero or a logical one is randomly selected and transmitted.

State machine 135 is used for circuits with short delay paths. A short delay path is defined as a circuit having a specified propagation time between a source latch and a destination latch of less than or equal to one half of the destination clock cycle.

Figure 4:
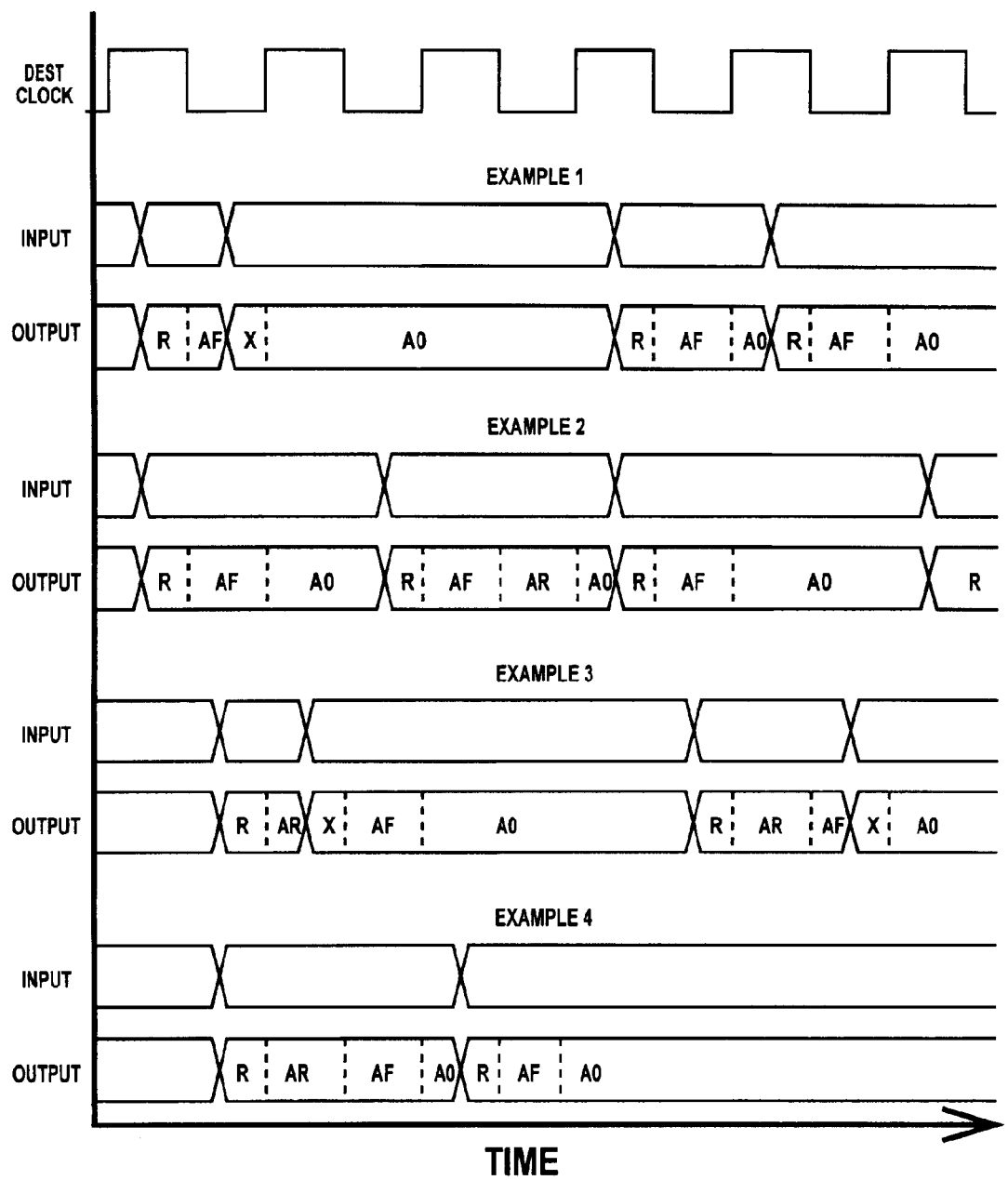
FIG. 4 is a set of exemplary timing diagrams of the state machine of FIG. 3.
Figure 5:
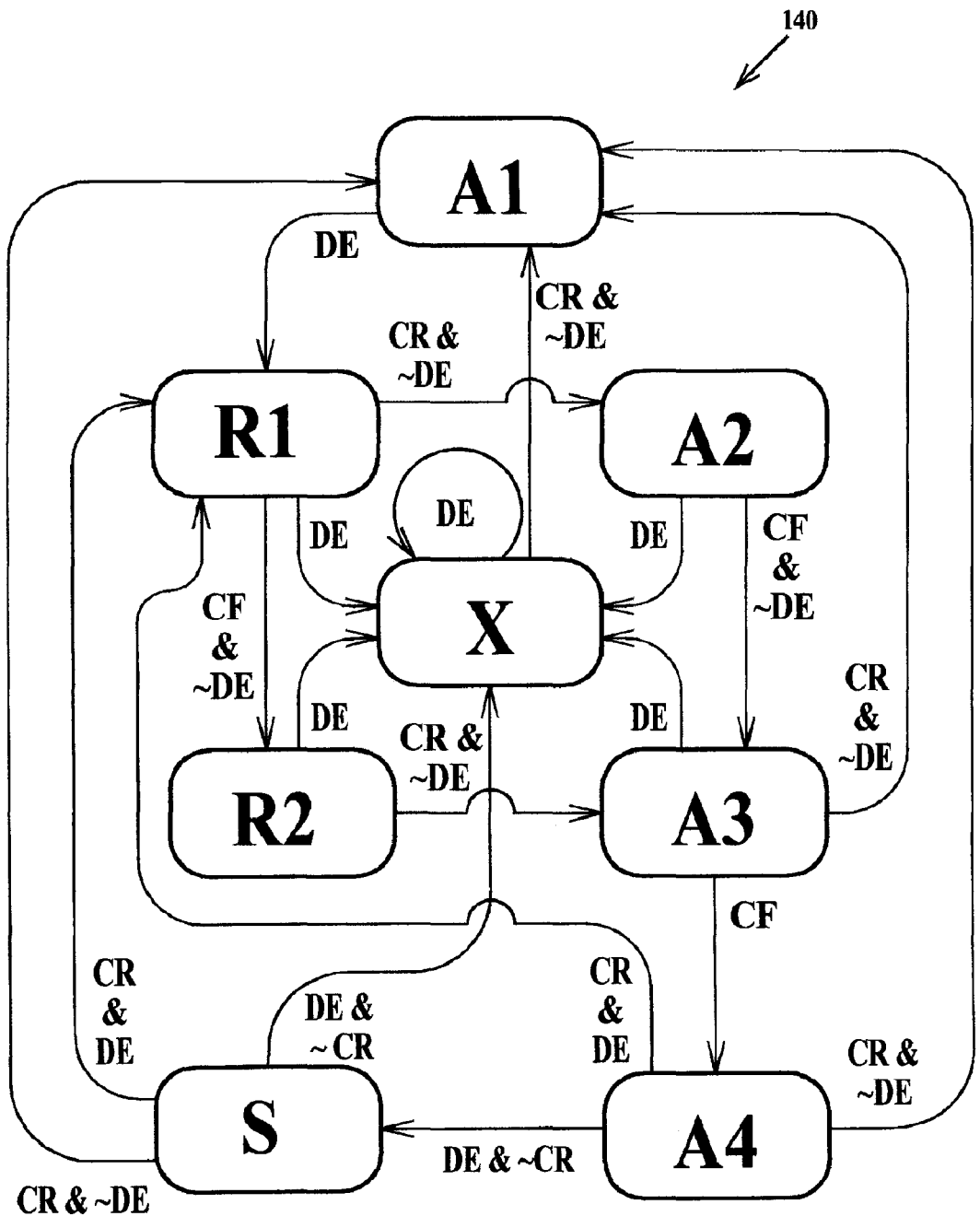
FIG. 5 is a diagram of a second exemplary state machine according to the present invention.

FIG. 4 is a set of exemplary timing diagrams of the state machine of FIG. 3. In examples 1 through 4, the input is the signal into the state machine and the output is the signal out of the state machine. The states from which the output signal is derived are shown for each example. The timing diagrams of FIG. 4 represent zero-delay simulation (relative to the destination latch clock domain) results applied to a simulation model of a logic circuit having asynchronous data paths using the WAM pseudo cells of the present invention.

In example 1, during a first asynchronous input transition the output becomes the value of the R state until a destination clock falling edge occurs at which time the output becomes the value of the AF state. After a second asynchronous input transition the output is X until a rising destination clock edge occurs after which the output has the value of the A0 state. After a third asynchronous input transition the output has the value of the R state. Upon the next falling edge of the destination clock, the output has the value of the AF state and after the next rising edge of the destination clock the output has the value of the A0 state. After a fourth asynchronous input transition the output has the value of the R state. Upon the next falling edge of the destination clock, the output has the value of the AF state and after the next rising edge of the destination clock the output has the value of the A0 state.

In example 2, after a first asynchronous input transition the output has the value of the R state. Upon the next falling edge of the destination clock, the output has the value of the AF state and after the next rising edge of the destination clock the output has the value of the A0 state. After a second asynchronous input transition the output has the value of the R state. Upon the next rising edge of the destination clock the output has the value of the AR state. Upon next falling edge clock edge of the destination clock the output has the value of the AF state. Upon the next rising edge of the destination clock the output has the value of the A0 state. After a third asynchronous input transition the output has the value of the R state. Upon the next falling edge of the destination clock, the output has the value of the AF state and after the next rising edge of the destination clock the output has the value of the A0 state. After a fourth asynchronous input transition the output has the value of the R state.

In example 3, after a first asynchronous input transition the output has the value of the R state. Upon the next rising edge of the destination clock, the output has the value of the AR state. After a second asynchronous input transition the output is X. Upon the next falling edge of the destination clock, the output has the value of the AF state. Upon the next rising edge of the destination clock, the output has the value of the A0 state. After a third asynchronous input transition the output has the value of the R state. Upon the next rising edge of the destination clock, the output has the value of the AR state and after the next falling edge of the destination clock the output has the value of the AF state. After a fourth asynchronous input transition the output is X. Upon the next rising edge of the destination clock, the output has the value of the A0 state.

In example 4, after a first asynchronous input transition the output has the value of the R state. Upon the next rising edge of the destination clock, the output has the value of the AR state, after the next falling edge of the destination clock the output has the value of the AF state and after the next rising edge of the destination clock, the output has the value of the A0 state. After a second asynchronous input transition the output has the value of the R state. Upon the next falling edge of the destination clock, the output has the value of the AF state. Upon the next rising edge of the destination clock, the output has the value of the A0 state.

FIG. 5 is a diagram of a second exemplary state machine according to the present invention. In FIG. 5, a WAM state machine 140 includes states A1, A2, A3, A4, R1, R2, S and X. In the A1, A2, A3, A4, R1, R2, S states the value of the data is either a logical one or a logical zero. Again, the X state is a state that indicates an asynchronous error and has no value. Data is transmitted between states when defined events occur. The defined events for state machine 140 are a data edge occurs (DE) at a destination latch data input, a destination latch clock rising edge occurs (CR), a destination clock falling edge (CF) occurs, a destination clock rising edge occurs not exactly at a data edge at a destination latch data input (CR & ~DE), a destination clock falling edge occurs not exactly at a data edge at a destination latch data input (CF & ~DE), a data edge at the input of a data clock occurs not exactly at a destination clock rising edge (DE & ~CR). The term not exactly at a clock rising edge (~CR) is defined as within a selected time of the clock rising edge (i.e. if the clock edge is early or late by a selected amount of time relative to the data transition).

A transition from the A1 state to the R1 state occurs upon a DE event. A transition from the R1 state to the X state occurs upon a DE event, to the A2 state upon a CR & ~DE event, and to the R2 state upon a CF & ~DE event. A transition from the A2 state to the X state occurs upon a DE event, and to the A3 state upon a CF & ~DE event. A transition from the R2 state to the X state occurs upon a DE event and to the A3 state upon a CR & ~DE event. A transition from the X state to the A10 state occurs upon a CR & ~DE event. A DE event in the X state causes state machine 140 to remain in the X state. A transition from the A3 state to the A1 state occurs upon a CR & ~DE event, to the A4 state upon a CF event, and to the X state upon a DE event. A transition from the A4 state to the A1 state occurs upon a CR & ~DE event, to the R1 state upon a CR & DE event and to the S state upon a DE & ~CR event. A transition from the s state to the A1 state occurs upon a CR & ~DE event, to the R1 state upon a CR & DE event and to the X state upon a DE & ~CR event.

From the A1, A2, A3 and A4 states actual data (either a logical zero or a logical one) is transmitted when a qualifying event for a transition from that state that state occurs. From the R1 and R2 states, a logical zero or a logical one is randomly selected and transmitted. From the S state saved data is transmitted. Saved data is always state A4 data from the last transition from state A4 to state S.

State machine 140 is used for circuits with long delay paths. A long delay path is defined as a circuit having a specified propagation time between the source latch and the destination latch of greater than logical one half of the destination clock cycle.

Figure 6:
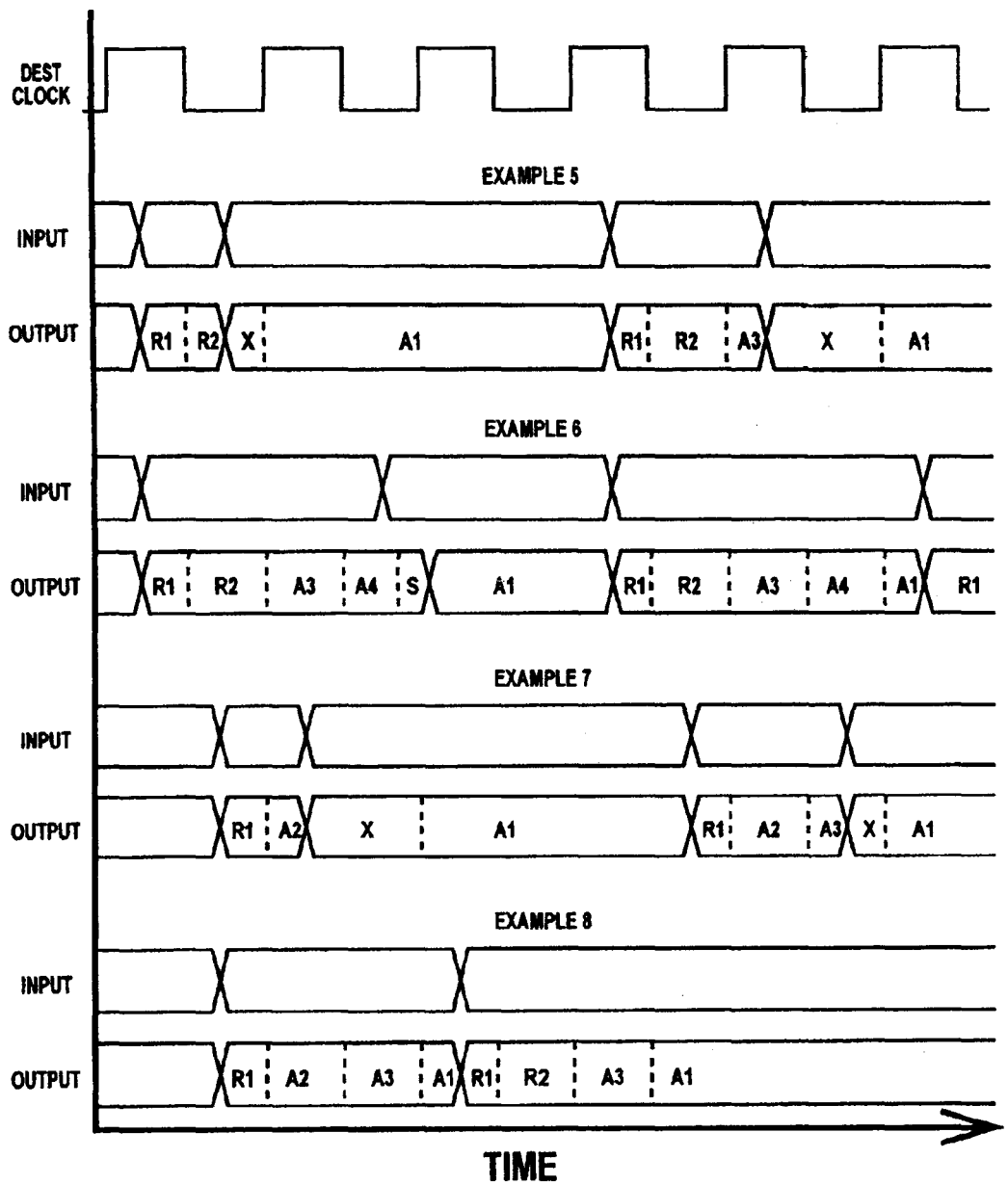
FIG. 6 is a set of exemplary timing diagrams of the state machine of FIG. 5.

FIG. 6 is a set of exemplary timing diagrams of the state machine of FIG. 5. In examples 5 through 8, the input is the signal into the state machine and the output is the signal out of the state machine. The states from which the output signal is derived are shown for each example. The timing diagrams of FIG. 6 represent zero-delay simulation (relative to the destination latch clock domain) results applied to a simulation model of a logic circuit having asynchronous data paths using the WAM pseudo cells of the present invention.

In example 5, during a first asynchronous input transition the output becomes the value of the R1 state until a destination clock falling edge occurs at which time the output becomes the value of the R2 state. After a second asynchronous input transition the output is X until a rising destination clock edge occurs after which the output has the value of the A1 state. After a third asynchronous input transition the output has the value of the R1 state. Upon the next falling edge of the destination clock, the output has the value of the R2 state and after the next rising edge of the destination clock the output has the value of the A3 state. After a fourth asynchronous input transition the output is X until the next rising edge of the destination clock where the output has the value of the A1 state.

In example 6, after a first asynchronous input transition the output has the value of the R1 state. Upon the next falling edge of the destination clock, the output has the value of the R2 state and after the next rising edge of the destination clock the output has the value of the A3 state. Upon the next falling edge of the destination clock, the output has the value of the S state. After a first synchronous input transition the output has the value of the A1 state. After a second asynchronous input transition the output has the value of the R1 state. Upon the next falling edge of the destination clock, the output has the value of the R2 state, after the next falling edge of the destination clock the output has the value of the A4 state and after the next rising edge of the destination clock the output has the value of the A1 state. After a third asynchronous input transition the output has the value of the R1 state.

In example 7, after a first asynchronous input transition the output has the value of the R1 state. Upon the next rising edge of the destination clock, the output has the value of the A2 state. After a second asynchronous input transition the output is X. Upon the next rising edge of the destination clock, the output has the value of the A1 state. After a third asynchronous input transition the output has the value of the R1 state. Upon the next rising edge of the destination clock, the output has the value of the A2 state and after the next falling edge of the destination clock the output has the value of the A3 state. After a fourth asynchronous input transition the output is X. Upon the next rising edge of the destination clock, the output has the value of the A1 state.

In example 8, after a first asynchronous input transition the output has the value of the R1 state. Upon the next rising edge of the destination clock, the output has the value of the A2 state, after the next falling edge of the destination clock the output has the value of the A3 state and after the next rising edge of the destination clock, the output has the value of the A1 state. After a second asynchronous input transition the output has the value of the R1 state. Upon the next falling edge of the destination clock, the output has the value of the R2 state. Upon the next rising edge of the destination clock, the output has the value of the A3 state. Upon the next falling edge of the destination clock, the output has the value of the A1 state.

Figure 7:
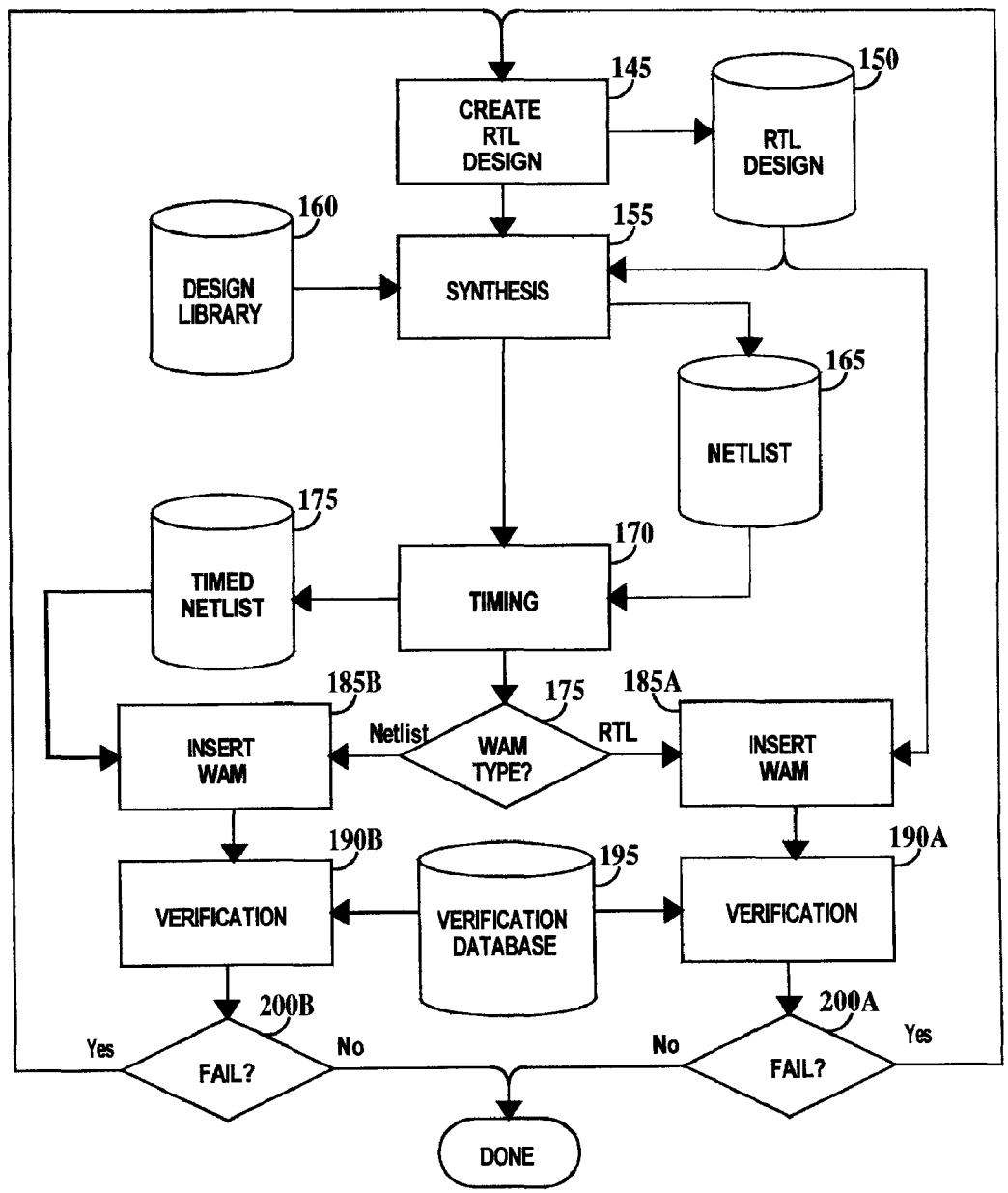
FIG. 7 is a flowchart of the method of simulation testing of digital logic circuit designs having asynchronous data paths according to the present invention.

FIG. 7 is a flowchart of the method of simulation testing of digital logic circuit designs having asynchronous data paths according to the present invention. In step 145, a register transfer logic (RTL) design of an integrated circuit is created and stored in RTL design 150. An RTL design is a type of hardware description language (HDL) file used in describing an integrated circuit design in terms of registers and the way in which data is transferred between the registers. In one example, RTL design 150 is written in Verilog (a type of HDL) by Cadence Design Systems of Santa Clara, Calif.

In step 155, synthesis is performed using RTL design 150 and elements selected from a design library to generate a netlist 165. Design library 160 includes, for example, such design elements as latches and logic gates. A netlist is a file listing each design element and connections between design elements.

In step 170 timing analysis is performed and a timed netlist 175 is generated. A timed netlist lists the propagation delays between design elements in addition to the information in netlist 165. Because design verification can be performed on timed netlist 175 or on RTL file 150 in step 180 a choice is made. If in step 180 it is decided to perform verification on RTL design 150, the method proceeds to step 185A.

Figure 8:
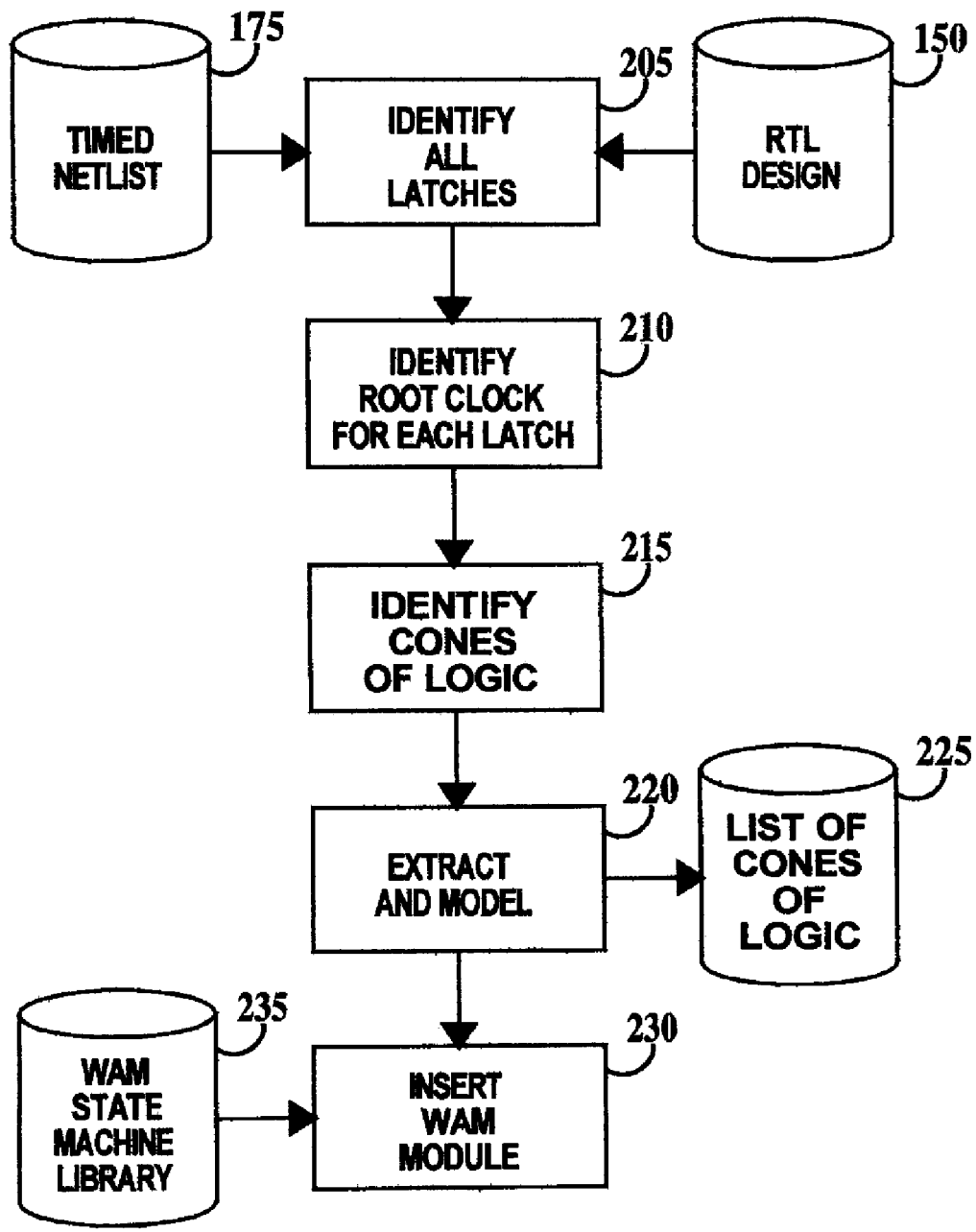
FIG. 8 is a flowchart of step 185A/185B of FIG. 7 for a method of simulation testing of digital logic circuit designs having asynchronous data paths according to the present invention.

In step 185A WAM pseudo cells are inserted into RTL design 150 (or more correctly a copy of RTL design 150). Insertion of WAM pseudo cells is illustrated in FIG. 8 and described infra.

Then in step 190A, verification is performed using a verification database 195. Verification database 195 includes a listing of tests to be performed, the conditions of the test (including whether to use the short delay or long delay WAM state machine).

Next, in step 200A, it is determined if the integrated design passes verification. If the integrated circuit design passes verification then the method is done, otherwise the method loops back to step 145 and changes are made to the integrated circuit design.

Returning to step 180, if in step 180 it is decided to perform verification on timed netlist 175, the method proceeds to step 185B. In step 185B WAM pseudo cells are inserted into timed netlist 175 (or more correctly a copy of timed netlist 175). Insertion of WAM pseudo cells is illustrated in FIG. 8 and described infra.

Then in step 190B, verification is performed using verification database 195. Next, in step 200B, it is determined if the integrated design passes verification. If the integrated circuit design passes verification then the method is done, otherwise the method loops back to step 145 and changes are made to the integrated circuit design.

FIG. 8 is a flowchart of step 185A/185B of FIG. 7 for a method of simulation testing of digital logic circuit designs having asynchronous data paths according to the present invention. In step 205 all latches in the RTL design 150 or timed netlist 175 are identified. There is a 1:1 correspondence between latches in RTL design 150 and timed netlist 175.

In step 210, the root clock for each latch is determined. This is the source of the clock signal connected each latch. A root clock is driven from a pin of a clock generator and not from another latch.

In step 215, all cones of logic that include a source latches coupled to a different clock domain than the clock domain to which a destination latch is connected are identified.

In step, 220 the cones of logic are extracted and modeled in the language in which verification is to be performed, for example, in Verilog. Within each cone of logic, for each destination latch that is asynchronous to any source latch, the logic function is replicated so there are as many logic functions as asynchronous destination latches, and the input of each logic function is wired to the output of all source latches while the output of each logic function is wired to the input of a different asynchronous destination latch. In the example of FIG. 1, the extracted cone of logic is source latches 105A, 105B, 105C, AND gate 110 and destination latches 115A and 115B. The modeled cones of logic are stored in a list of cones of logic 225.

In step 230 WAM pseudo cells are inserted into the asynchronous data paths of the extracted cones of logic from a library of WAM state machines 235. While two WAM state machines have been described supra, the present invention is not limited to the two WAM state machines and other state machines different from state machine 135 (see FIG. 3) and state machine 140 (see FIG. 5) as well as different combinations of WAM state machines may be used. Step 230 is illustrated in FIG. 9 and described infra.

Figure 9:
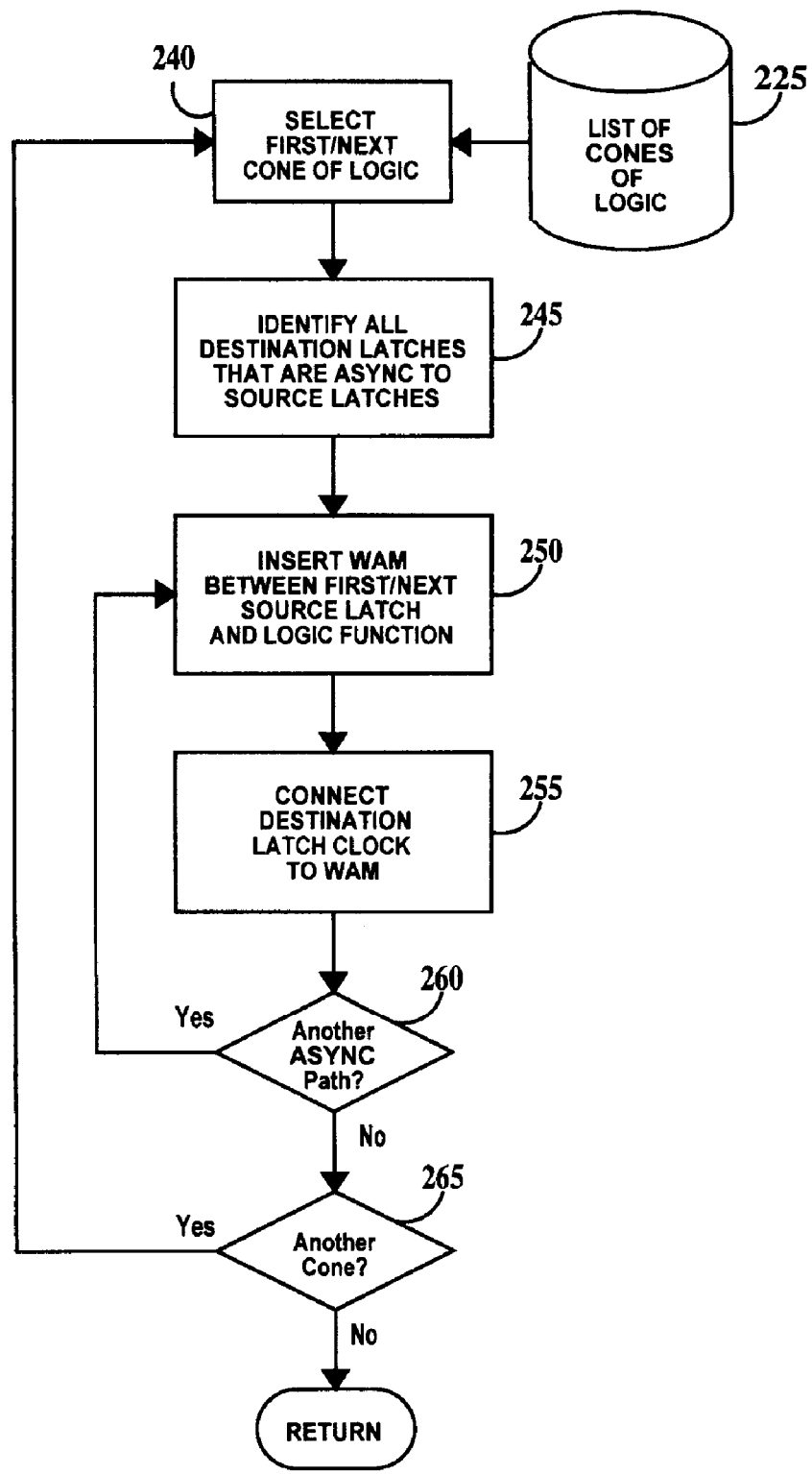
FIG. 9 is a flowchart of step 230 of FIG. 8 for a method of simulation testing of digital logic circuit designs having asynchronous data paths according to the present invention.

FIG. 9 is a flowchart of step 230 of FIG. 8 for a method of simulation testing of digital logic circuit designs having asynchronous data paths according to the present invention. In step 240, the first/next cone of logic is selected from list of modeled cones of logic 225. In step 245, the source latches that are asynchronous to the destination latch are identified. In step 250, a WAM pseudo cell is inserted between the first/next asynchronous source latch and the logic function (in the example of FIG. 1, the logic function is AND gate 110). In step 255, the same clock as the destination latch is coupled to is coupled to the WAM pseudo cell just inserted.

In step 260 it is determine if another asynchronous path exists within the current modeled cone of logic (in the example of FIG. 1, there are two asynchronous paths as discussed supra). If in step 260, there are other asynchronous paths then the method loops back to step otherwise the method proceeds to step 265.

In step 265 it is determine if another modeled cone of logic exists in the design. If in step 265, there are other cones of logic then the method loops back to step otherwise the method returns to step 185A or 185B of FIG. 7.

Figure 10:
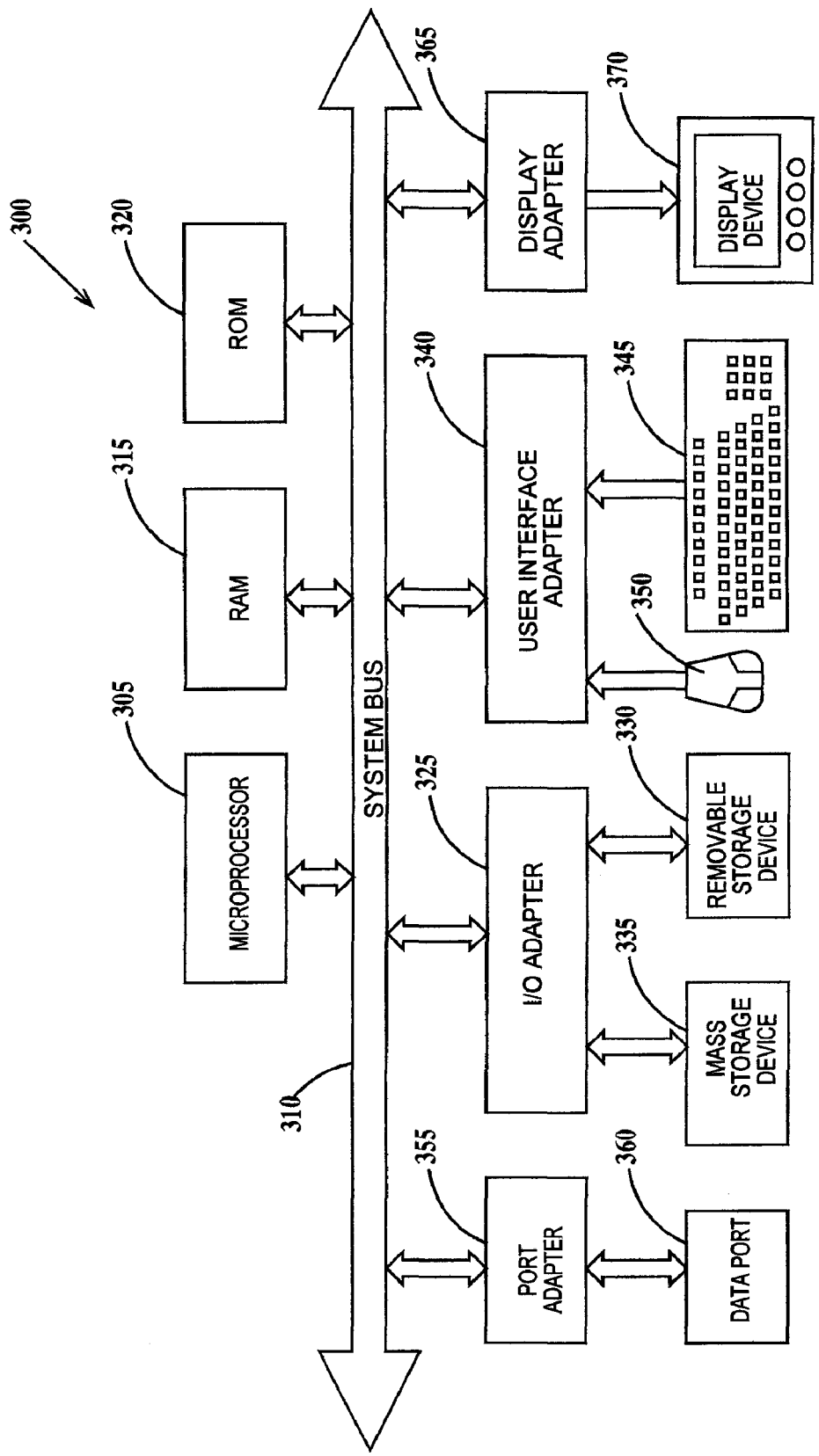
FIG. 10 is a schematic block diagram of a general-purpose computer for practicing the present invention.

Generally, the method described herein with respect to a method of simulation testing of digital logic circuit designs having asynchronous data paths is practiced with a general-purpose computer and the method may be coded as a set of instructions on removable or hard media for use by the general-purpose computer. FIG. 10 is a schematic block diagram of a general-purpose computer for practicing the present invention. In FIG. 10, computer system 300 has at least logical one microprocessor or central processing unit (CPU) 305. CPU 305 is interconnected via a system bus 310 to a random access memory (RAM) 315, a read-only memory (ROM) 320, an input/output (I/O) adapter 325 for a connecting a removable data and/or program storage device 330 and a mass data and/or program storage device 335, a user interface adapter 340 for connecting a keyboard 345 and a mouse 350, a port adapter 355 for connecting a data port 360 and a display adapter 365 for connecting a display device 370.

ROM 320 contains the basic operating system for computer system 300. The operating system may alternatively reside in RAM 315 or elsewhere as is known in the art. Examples of removable data and/or program storage device 330 include magnetic media such as floppy drives and tape drives and optical media such as CD ROM drives. Examples of mass data and/or program storage device 335 include hard disk drives and non-volatile memory such as flash memory. In addition to keyboard 345 and mouse 350, other user input devices such as trackballs, writing tablets, pressure pads, microphones, light pens and position-sensing screen displays may be connected to user interface 340. Examples of display devices include cathode-ray tubes (CRT) and liquid crystal displays (LCD).

A computer program with an appropriate application interface may be created by logical one of skill in the art and stored on the system or a data and/or program storage device to simplify the practicing of this invention. In operation, information for or the computer program created to run the present invention is loaded on the appropriate removable data and/or program storage device 330, fed through data port 360 or typed in using keyboard 345.

The Verilog code implementing the WAM pseudo cell state machines illustrated in FIGS. 3 and 5 and described supra is listed infra. The parameter half_cycle_delay_timing_closure =0 indicates that the long delay state machine is to be used.

```
// $Revision: 1.5 $
`timescale 100 fs/100 fs
module wam (
    dst_clk,
    datain,
    dataout
);
    input dst_clk;
    input datain;
    output dataout;
    parameter half_cycle_delay_timing_closure = 0;
    parameter random_seed = 0;
    reg XXXX;
    reg RND1;
    reg RND2;
    reg SAVE;
    reg ACT1;
    reg ACT2;
    reg ACT3;
    reg ACT4;
    reg CLKR;
    reg CLKF;
    reg DATE;
    reg [31:0] random_number;
    reg random_data;
    reg wam_data;
    reg delay_data;
    reg save_data;
`ifndef WAM_ON
    assign dataout = datain;
`else
    // -------------
    // clock input edge detect
    // -------------
    always @(dst_clk)
      begin
        if (dst_clk == 1'bx)
          begin
            CLKR <= 1;
            CLKF <= 0;
          end
        else
          begin
            CLKR <= dst_clk;
            CLKF <= ~dst_clk;
          end
      end
    // -------------
    // state machine
    // -------------
    always @(posedge CLKF or posedge CLKR or datain)
      begin
        save_data <= ~datain;
        // -----------------
        // data input edge detect
        // -----------------
        if (delay_data == datain)
          DATE = 0;
        else
          DATE = 1;
        delay_data <= datain;
        // -----------------
        // random data generation
        // -----------------
        if (DATE == 1)
          begin
            if (random_seed == 0)
              random_number = $random;
            else
              random_number = $random(random_number);
            if ((random_number % 2) == 0)
              wam_data <= ~datain;
            else
              wam_data <= datain;
          end
        // -----------------
        // state machines
        // -----------------
        if (half_cycle_delay_timing_closure == 0)
          begin
            XXXX <= ((RND1 | RND2 | ACT2 | ACT3) & DATE) | (SAVE & ~CLKR & DATE) | (XXXX & ~CLKR);
            RND1 <= (ACT1 & DATE) | (SAVE & DATE & CLKR) | (ACT4 & CLKR & DATE) | (ACT3 & CLKR & DATE) | (XXXX & CLKR & DATE) | (RND1 & ~DATE & ~CLKR & ~CLKF);
            RND2 <= (RND1 & CLKF & ~DATE) | (RND2 & ~DATE & ~CLKR);
            SAVE <= (ACT4 & DATE & ~CLKR) | (SAVE & ~DATE & ~CLKR);
            ACT1 <= (SAVE & CLKR & ~DATE) | (ACT4 & CLKR & ~DATE) | (ACT3 & CLKR & ~DATE) | (XXXX & CLKR & ~DATE) | (ACT1 & ~DATE);
            ACT2 <= (RND1 & CLKR & ~DATE) | (ACT2 & ~DATE & ~CLKF);
            ACT3 <= (ACT2 & CLKF & ~DATE) | (RND2 & CLKR & ~DATE) | (ACT3 & ~DATE & ~CLKR & ~CLKF);
            ACT4 <= (ACT3 & CLKF) | (ACT4 & ~DATE & CLKF);
          end
        else
          begin
            XXXX <= ((RND1 | ACT2) & DATE) | (ACT3 & ~CLKR & DATE) | (XXXX & ~CLKR);
            RND1 <= (ACT1 & DATE) | (ACT3 & CLKR & DATE) | (XXXX & CLKR & DATE) | (RND1 & ~DATE & ~CLKR & ~CLKF);
            RND2 <= 0;
            SAVE <= 0;
            ACT1 <= (ACT3 & CLKR & ~DATE) | (XXXX & CLKR & ~DATE) | (ACT1 & ~DATE);
            ACT2 <= (RND1 & CLKR & ~DATE) | (ACT2 & ~DATE & ~CLKF);
            ACT3 <= (ACT2 & CLKF & ~DATE) | (RND1 & CLKF & ~DATE) | (ACT3 & ~DATE & ~CLKR);
            ACT4 <= 0;
          end
      end
    // -------------
    // output data assignment
    // -------------
    assign dataout = ((ACT1 | ACT2 | ACT3 | ACT4) & delay_data)
                   || ((RND1 | RND2) & wam_data)
                   || ((SAVE) & save_data)
```

```
                || ((XXXX) & 1'bx);
    initial
      begin
        // -------------
        // inputs
        // -------------
        CLKR = 1'b0;
        CLKF = 1'b0;
        DATE = 1'b0;
        // -------------
        // state machine
        // -------------
        XXXX = 1'b1;
        RND1 = 1'b0;
        RND2 = 1'b0;
        SAVE = 1'b0;
        ACT1 = 1'b0;
        ACT2 = 1'b0;
        ACT3 = 1'b0;
        ACT4 = 1'b0;
        // -------------
        // random data
        // -------------
        if (random_seed == 0)
          random_number = $random;
        else
          random_number = $random(random_seed);
        random_data = random_number[0];
        wam_data = random_data;
      end
    `endif
  endmodule
```

Alternatively, WAM pseudo cells may be inserted directly into the RTL design and encapsulated using "IFDEF" statements, which allow WAM pseudo cells to function during simulation, but act as wires during synthesis, and the WAM pseudo cells enabled or disabled either individually or globally. When disabled, WAM pseudo cells are ignored by the synthesis and simulation steps that were described supra.

Thus the present invention provides a simulation methodology for testing and verifying digital logic circuits having asynchronous data paths. The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. For example, other state machines can be devised to add random skew to the data paths other than the state machines described supra. Therefore, it is intended that the following claims cover all such modifications and changes as fall within the true spirit and scope of the invention.

What is claimed is:

1. A method of testing a circuit design, comprising:
generating a simulation model of said circuit design, said circuit design comprising one or more source latches, one or more destination latches and a logic function connected between said source latches and said destination latches;
randomly generating a time skew;
generating a modified simulation model of said simulation model by inserting said randomly generated time skew between an output of each source latch and an input of said logic function only in asynchronous data paths between said source latches and said destination latches of said simulation model; and
applying a simulated input to a data input of each source latch of said one or more source latches of said modified simulation model.

2. The method of claim 1, said generating said modified simulation model further including:
for each asynchronous destination latch of said one or more destination latches in excess of one asynchronous destination latch, generating an additional logic function, each additional logic function identical to said logic function;
coupling the input of each additional logic function to the output of each source latch;
decoupling each asynchronous destination latch except one from said output of said logic function; and
coupling an output of each additional logic function to the input of a different asynchronous destination latch that is not coupled to said logic function.

3. The method of claim 1, wherein said inserting randomly generated time skew includes inserting a state machine model between said output of each source latch and said input of said logic function only in said asynchronous data paths between said source latches and said logic function of said simulation model.

4. The method of claim 3, wherein said inserting said state machine model includes selecting one of one or more state machine models to insert based on a designed data propagation delay time from said one or more source latches to said one or more destination latches through said logic function.

5. The method of claim 3, further including, for each said asynchronous data path:
coupling said state machine model to the same clock domain as said destination latch is coupled to.

6. The method of claim 1, wherein said inserting said randomly generated time skew includes changing an actual logic level of a data signal propagated between a particular source latch of said one or more source latches and said logic function to a randomly selected logic level.

7. The method of claim 6, wherein said inserting said randomly generated time skew further includes changing said randomly selected logic level to a new logic level upon a rising or a falling clock edge of a clock coupled to a destination latch of said one or more destination latches corresponding to said particular source latch, said rising or falling clock edge occurring within a selected time of a change of said logic level of said data signal to said new logic level.

8. A method of testing a circuit design, comprising:
(a) generating a simulation model of said circuit design, said circuit design comprising one or more source latches, each source latch responsive to one of two or more clock domains, one or more destination latches, each destination latch responsive to one of said two or more of said clock domains, at least one destination latch and one source latch responsive to different clock domains of said two or more clock domains, and a logic function connected between outputs of said source latches and inputs of said destination latches;
(b) identifying a source clock domain for each source latch and a destination clock domain for each destination latch;
(c) for a given destination latch identifying all source latches coupled to a different clock domain than said destination clock domain;
(d) inserting a state machine model, having random transitions between states, between an output of each source latch identified in step (c) and a corresponding input of said logic function in said simulation model;

(e) coupling each state machine model inserted in step (d) to said destination clock domain; and (f) running said simulation model.

9. The method of claim 8, step further including, between steps (c) and (d), when there are two or more destination latches responsive to different destination clock domains:

replicating said logic function a sufficient number of times so there are as many identical logic functions as destination latches in said simulation model; and within said simulation model, coupling an input of each logic function to said output of each source latch and coupling an output of each logic function to the input of a different destination latch.

10. The method of claim 8, wherein each state machine model includes:

one or more random states, logic levels of said one or more random states randomly set;

two or more actual states, logic levels of said two or more actual states based on logic levels stored in said source latches; and an error state.

11. The method of claim 10, wherein:

said state machine model is adapted to transition from a particular random state of said one or more random states to a particular actual state of said two or more actual states upon a rising or a falling clock edge of a particular clock domain of said two or more clock domains, said particular clock domain coupled to a particular destination latch of said one or more destination latches, said particular destination latch of said one or more destination latch coupled to said state machine model, said rising or falling clock edge occurring within a selected time of a change of a logic level of a particular source latch of said one or more source latches connected to said state machine model.

12. The method of claim 10, wherein said state machine model is adapted to transition from a first actual state of said two or more actual states to a second actual state of said two or more actual states upon a rising or a falling clock edge of a particular clock domain of said two or more clock domains, said particular clock domain coupled to a particular destination latch of said one or more destination latches, said particular destination latch of said one or more destination latch coupled to said state machine model, said rising or falling clock edge occurring within a selected time of a change of a logic level of a particular source latch of said one or more source latches connected to said state machine model.

13. The method of claim 10, said state machine model is adapted to transition from a particular actual state of said two or more actual states to a particular random state of said one or more random states upon a rising or a falling clock edge of a particular clock domain of said two or more clock domains, said particular clock domain coupled to a particular destination latch of said one or more destination latches, said particular destination latch of said one or more destination latch coupled to said state machine model, said rising or falling clock edge occurring within a selected time of a change of a logic level of a particular source latch of said one or more source latches connected to said state machine model.

14. A computer system comprising a processor, an address/data bus coupled to said processor, and a computer-readable memory unit coupled to said processor, said memory unit containing instructions that when executed by said processor implement a method for testing a circuit design, said method comprising the computer implemented steps of:

generating a simulation model of said circuit design, said circuit design comprising one or more source latches, one or more destination latches and a logic function connected between said source latches and said destination latches;

randomly generating a time skew;

generating a modified simulation model of said simulation model by inserting said randomly generated skew between an output of each source latch and an input of said logic function only in asynchronous data paths between said source latches and said destination latches of said simulation model; and applying a simulated input to a data input of each source latch of said one or more source latches of said modified simulation model.

15. The system of claim 14, said generating said modified simulation model further including:

for each asynchronous destination latch of said one or more destination latches in excess of one asynchronous destination latch, generating an additional logic function, each additional logic function identical to said logic function;

coupling the input of each additional logic function to the output of each source latch;

decoupling each asynchronous destination latch except one from said output of said logic function; and coupling an output of each additional logic function to the input of a different asynchronous destination latch that is not coupled to said logic function.

16. The system of claim 14, wherein said inserting randomly generated time skew includes inserting a state machine model between said output of each source latch and said input of said logic function only in said asynchronous data paths between said source latches and said logic function of said simulation model.

17. The system of claim 14, wherein said inserting said state machine model includes selecting one of one or more state machine models to insert based on a designed data propagation delay time from said one or more source latches to said one or more destination latches through said a logic function.

18. The system of claim 14, further including, for each said asynchronous data path:

coupling said state machine model to the same clock domain as said destination latch is coupled to.

19. The system of claim 14, wherein said inserting said randomly generated time skew includes changing an actual logic level of a data signal propagated between a particular source latch of said one or more source latches and said logic function to a randomly selected logic level.

20. The system of claim 19, wherein said inserting said randomly generated time skew further includes changing said randomly selected logic level to a new logic level upon a rising or a falling clock edge of a clock coupled to a destination latch of said one or more destination latches corresponding to said particular source latch, said rising or falling clock edge occurring within a selected time of a change of said logic level of said data signal to said new logic level.

* * * * *